United States Patent [19]
Song

[11] Patent Number: 5,767,729
[45] Date of Patent: Jun. 16, 1998

[54] DISTRIBUTION CHARGE PUMP FOR NONVOLATILE MEMORY DEVICE

[75] Inventor: Paul Jei-Zen Song, Sunnyvale, Calif.

[73] Assignee: Integrated Silicon Solution Inc., Santa Clara, Calif.

[21] Appl. No.: 742,073

[22] Filed: Oct. 31, 1996

[51] Int. Cl.$^6$ ................................. H03K 17/16
[52] U.S. Cl. ........................... 327/390; 327/536
[58] Field of Search ............................. 327/390, 536, 327/538, 589, 537, 544

[56] References Cited

U.S. PATENT DOCUMENTS

| | | | |
|---|---|---|---|
| 5,039,882 | 8/1991 | Arakawa | 307/449 |
| 5,336,952 | 8/1994 | Iwahashi et al. | 307/571 |
| 5,513,142 | 4/1996 | Arimoto et al. | 365/189.11 |
| 5,594,380 | 1/1997 | Nam | 327/390 |
| 5,677,645 | 10/1997 | Merritt | 327/536 |

*Primary Examiner*—Timothy P. Callahan
*Assistant Examiner*—Jung Ho Kim
*Attorney, Agent, or Firm*—Douglas J. Crisman; Flehr Hohbach Test Albritton & Herbert LLP

[57] ABSTRACT

A distribution charge pump is disclosed that provides a high voltage output that can be used to write or erase EEPROM cells. The charge pump is enabled by a high (VCC) input signal, which is input to a pair of always-on pass transistors. The output of one of these pass transistors turns on a third transistor whose source is tied to an internal node that is coupled to one terminal of a MOS capacitor and the gate of a fourth transistor. The other terminal of the MOS capacitor is tied to a clock signal and the source and drain of the fourth transistor are tied respectively to the charge pump output and a high voltage power supply node (VPP). The capacitor stores charge on the internal node when the clock signal goes high and discharges when the clock signal goes low. Due to this discharge, the voltage at the internal node drops, which causes the third transistor to turn on and supply charge to the internal node, preventing the complete discharge of charges stored during the positive phase of the clock cycle. Therefore, the voltage at the first node rises over subsequent clock pulses. The fourth transistor turns on whenever the voltage at the first node is above threshold; thus the pump output tracks the voltage on the internal node. Because the drain of the second pump transistor is tied to VPP, the pump output can never rise higher than VPP, which prevents high voltage problems in the memory circuits.

16 Claims, 6 Drawing Sheets

DISTRIBUTION CHARGE PUMP FOR NONVOLATILE MEMORY DEVICE

The present invention relates generally to nonvolatile semiconductor memory systems, such as EEPROMS, and more specifically to an on-chip distribution charge pump for nonvolatile memories.

BACKGROUND OF THE INVENTION

EEPROM memories are known in the art. An individual EEPROM memory cell includes a metal-oxide-semiconductor ("MOS") device having spaced-apart drain and source regions fabricated on a substrate and defining a channel region therebetween. A thin gate oxide layer lies between the channel region and a floating, charge-retaining storage gate that is unconnected to the outside. A very thin tunneling oxide partially overlaps a portion of the drain area and a control gate at least partially overlies the floating gate (FG) and is insulated therefrom.

In practice, a plurality of such memory cells is arrayed in addressable rows and columns to form a memory array. Individual cells in the array are accessed for purposes of writing, reading or erasing data by decoding row and column information. Typically, the control gates for a group of cells in a given row are formed from a continuous strip of conductive material. A typical row might comprise, for example, a group of eight cells that collectively store one byte. Each row of cells can only be accessed when a corresponding word line, abbreviated "WL", is asserted. For a given column in the array, the drain leads of all cells in the column are coupled to a so-called bit line, abbreviated "BL", through which the cells are read and erased. The source leads of the various cells are collectively switchably coupled to a virtual ground representing one of several potential levels, depending upon whether cells in the array are to be programmed/erased or are to be read.

Within the memory array, an individual cell is addressed and thus selected for reading or for programming (e.g., writing or erasing) by specifying its row (or word line) as an x-axis coordinate, and its column (or bit line) as a y-axis coordinate. A 16K-bit memory, for example, may comprise an array of 128×128 bits, in which there are 128 x-axis word lines and 128 y-axis bit lines. Commonly, blocks of memory cells are collectively grouped into words, blocks or sectors. Cell addressing is accomplished by coupling address bits to precoding x-decoders and to precoding y-decoders whose respective outputs are coupled to word lines and bit lines in the array.

Writing an addressed MOS memory cell occurs in a write mode by grounding the control gate and coupling the drain to a high positive potential of perhaps ±15V. This causes electrons to tunnel out of the floating gate across the tunneling oxide to the drain, which leaves positive charge on the floating gate. As a result, the transistor turns on (i.e., maintains a significant current flow during read mode). Typically, an EEPROM cell is erased by coupling the cell's control gate to a high positive potential of perhaps ±15 volts, and drain, source and substrate to 0 VDC, which encourages negative charges to tunnel from the drain-extension to the floating gate.

In a read mode, the charge stored on the floating gate of an addressed MOS memory cell is read by coupling perhaps ±5 VDC to the control gate, and reading drain-to-source current. The presence or absence of charge on the stored gate defines a binary "1" or "0" bit that is read-out from the addressed memory cell by a sense amplifier coupled to the bit line.

In the various read, program or erase modes, the gate, drain and source voltages are determined by the voltages on respective combinations of the word lines, bit lines and, possibly, other control lines. Some non-volatile memory systems provide a separate high-voltage power supply to drive these lines to the high positive potential (e.g., 15 VDC) necessary to achieve the high gate and drain voltages necessary for writing and erasing the EEPROM cells. Other EEPROM memory systems, which provide only a single 2 VDC, to 5 VDC power supply, achieve the requisite high voltages through a of main charge pump that "pumps" the 2–5 volt signals up to high voltage (e.g. ±15 VDC) signals, which can then be used to write or erase the EEPROM cells. The memory systems also provide distribution charge pumps that transform normal logic signals at 0 volts and VCC respectively to 0 volt or high voltage states.

Figure 2A:
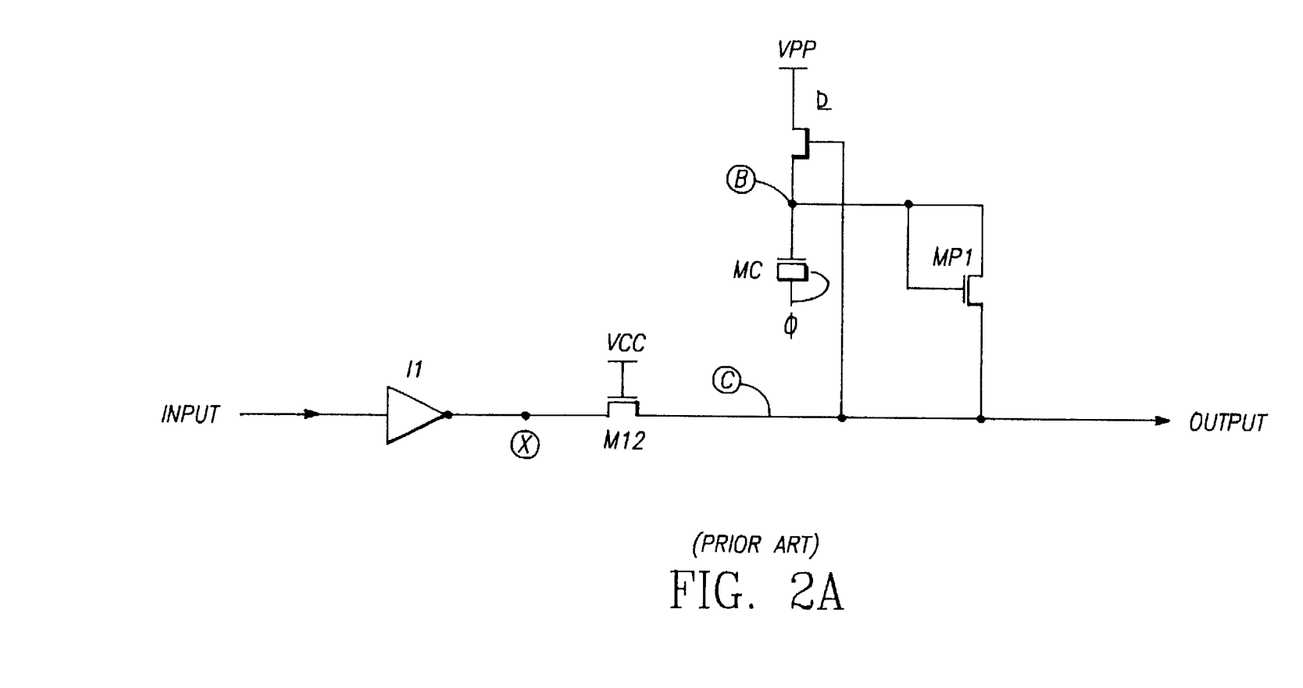
FIG. 2A is a block diagram of the a prior art charge pump for a non-volatile memory.

Referring to FIG. 2A, there is shown a circuit diagram of one such prior art distribution charge pump for use in a single-supply EEPROM. The circuit is enabled by a high-to-low transition of the 2–5 volt input signal (INPUT) to generate an output signal (OUTPUT) that rises from 0 VDC to a large positive potential. The resulting OUTPUT signal is coupled to an appropriate word line (WL) by an X decoder so that the appropriate cell can be programmed.

The charge pump of FIG. 2A includes an input buffer 11, a NMOS enhancement-mode pass transistor M12 with threshold voltage ($Vt_{M12}$) between 0 and 0.9 volts, a MOS capacitor MC and two NMOS enhancement-mode pump transistors MP1 and MP2. In an alternative version of the same circuit, the transistors MP1 and MP2 could also be NMOS native mode transistors. Input signals (INPUT) in need of pumping are input to the distribution charge pump at the input of the buffer 11. The output of the input buffer 11 (node X) is coupled to the drain of the transistor M12, whose gate and source are respectively coupled to VCC (e.g., +5 VDC) and node C. Also coupled to node C are the output (OUTPUT) of the charge pump, the source of the transistor MP1 and the gate of the transistor MP2. The drain and source of MP2 are respectively tied to the VPP node (e.g., +15 VDC), which is typically generated by a main charge pump (not shown) from the 2–5 volt output of the single power supply, and node B. Node B is also coupled to one terminal of the MOS capacitor MC and to the gate and drain of the transistor MP1. The other terminal of the capacitor MC (node A) is coupled to a clock signal φ; consequently, the capacitor MC stores charge at node B when the clock signal makes a low to high transition and discharges when the clock signal makes a high to low transition.

Figure 2B:
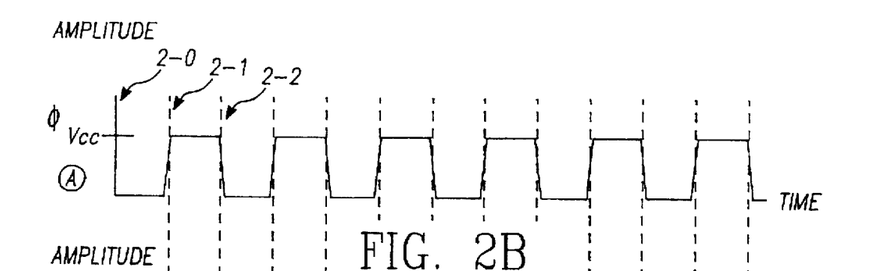
FIG. 2B is a voltage versus time plot of the clock signal provided at node A of FIG. 2A.
Figure 2C:
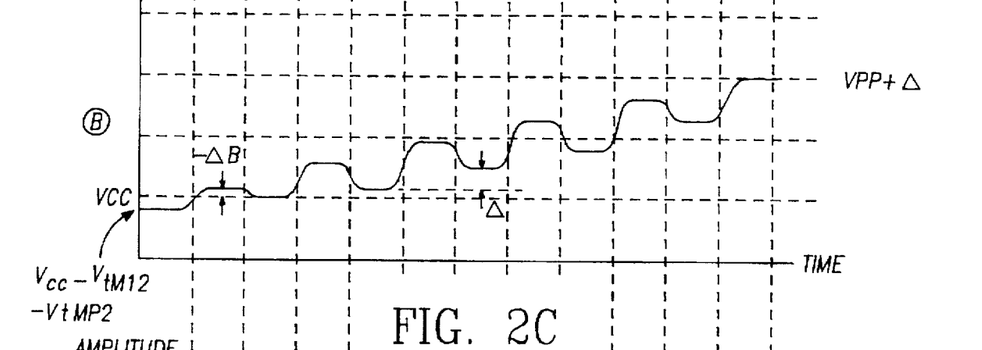
FIG. 2C is a plot of the voltage at node B of FIG. 2A while the charge pump is enabled.
Figure 2D:
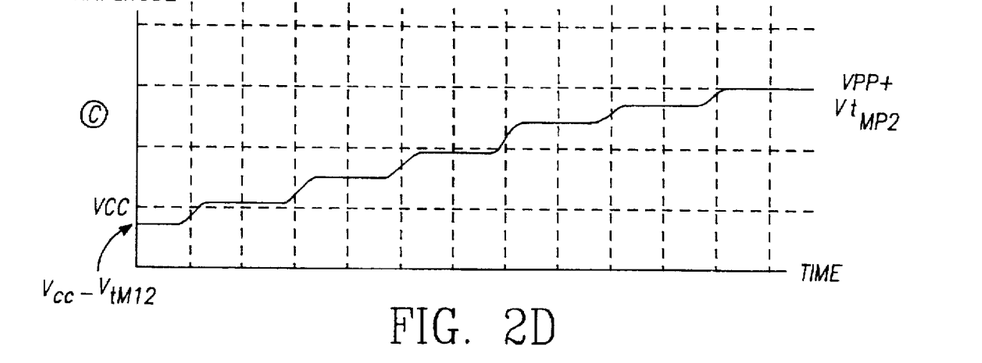
FIG. 2D is a plot of the output signal provided at node C by the charge pump of FIG. 2A.

FIGS. 2B, 2C and 2D respectively show voltage versus time plots of the clock signal φ, the signal at node B and the OUTPUT signal at node C. The operation of the prior art circuit of FIG. 2A is now described in reference to these figures. Initially (at time 2-0), the INPUT signal (not shown) makes a transition from high to low and, in response, the input buffer 11 outputs a low to high signal (not shown) that is coupled to node X. Because the gate of the transistor M12 is tied to VCC, a high signal at node X is always passed by the transistor M12 to node C and the output (OUTPUT) of the charge pump. This means that, following the low to high transition of the INPUT signal at time 2-0, the voltage at node C goes to $VCC-Vt_{M12}$ (where $Vt_{M12}$ is the threshold voltage of the pass transistor M12). Because the transistor MP2 turns on anytime the voltage difference between its gate (node C) and source (node B) exceeds its threshold voltage ($Vt_{MP2}$), as soon as node C goes high, the transistor MP2 turns on and pulls up the voltage at node B ($V_B$) to $VCC-Vt_{MI2}-Vt_{MP2}$. This $V_B$ level does not immediately turn on the transistor MP1, whose source (node C) is still more positive than its gate (node B).

At time 2-1, the clock signal φ rises to VCC, which places the capacitor MC in a charge storage mode. At the same time, the already-on transistor MP2 couples current and charge from the VPP node to node B, where the charge contributed by VPP is stored by the capacitor MC. This accumulated charge causes the voltage at node B ($V_B$) to rise, which eventually causes the transistor MP1 to turn on. Once turned on, the transistor MP1 pulls up the voltage of the OUTPUT signal (node C) until it rises to within a threshold drop (of transistor MP1) of $V_B$. As the result of node C being pulled up, MP2 turns on even more strongly when the clock φ makes a high to low transition, further increasing $V_B$, which in turn causes MP1 to turn on harder the next time the clock φ goes from low to high (i.e., the nodes B and C bootstrap each other). Based on the configuration of the circuit elements MC, MP1 and MP2, while the clock signal is high, $V_B$ and the OUTPUT signal stabilize (at higher than previous levels), with $V_B$ within $Vt_{MP2}$ of the OUTPUT voltage. The difference between the highest $V_B$ levels for subsequent pumping cycles is denoted "Δ".

When the clock signal goes low (e.g., at time 2-2), node B begins to discharge through the capacitor MC, causing the voltage at node B ($V_B$) to drop. This discharge does not affect the OUTPUT signal, which is isolated from node B by the (now-off) transistor MP1. At some point while the clock signal is low, the voltage at node B falls more than $Vt_{MP2}$ below the OUTPUT voltage, which causes the transistor MP2 to strongly turn on. Once the transistor MP2 turns on, it supplies as much charge to node B from the VPP node as is discharged by the capacitor MC, which stabilizes $V_B$. The circuit elements of FIG. 2A are selected so that the drop in $V_B$ during the low phase of any pumping cycle (denoted on FIG. 2C as "−ΔB") is always less than the voltage gain Δ. This means that, over subsequent pumping cycles, each of which proceeds as described above, the OUTPUT of the charge pump is able to continue rising until it reaches $VPP+Vt_{MP2}$ (FIG. 2D).

Thus, the prior art provides a distribution charge pump that provides a positive high voltage output signal in response to a logic '1' input signal. However, the fact that the positive high voltage output signal goes to $VPP+Vt_{MP2}$, a voltage level higher than the optimum level for programming (i.e., VPP), could cause high voltage-related problems in the flash cells being programmed. These high voltage problems include breakdown, punch-through and field-transistor turn-on.

To prevent to these high voltage problems, there is a need for a distribution charge pump for use in a non-volatile memory that provides a high voltage pumping signal that does not exceed the level of the high voltage power supply (VPP). There is also need for a charge pump that meets the need set out above but does so in a way that limits energy consumption when the charge pump is not in operation.

SUMMARY OF THE INVENTION

The present invention is a distribution charge pump for use in an EPROM/flash memory array that provides a high voltage pumping signal that does not exceed the level of the high voltage power supply (VPP).

Figure 3A:
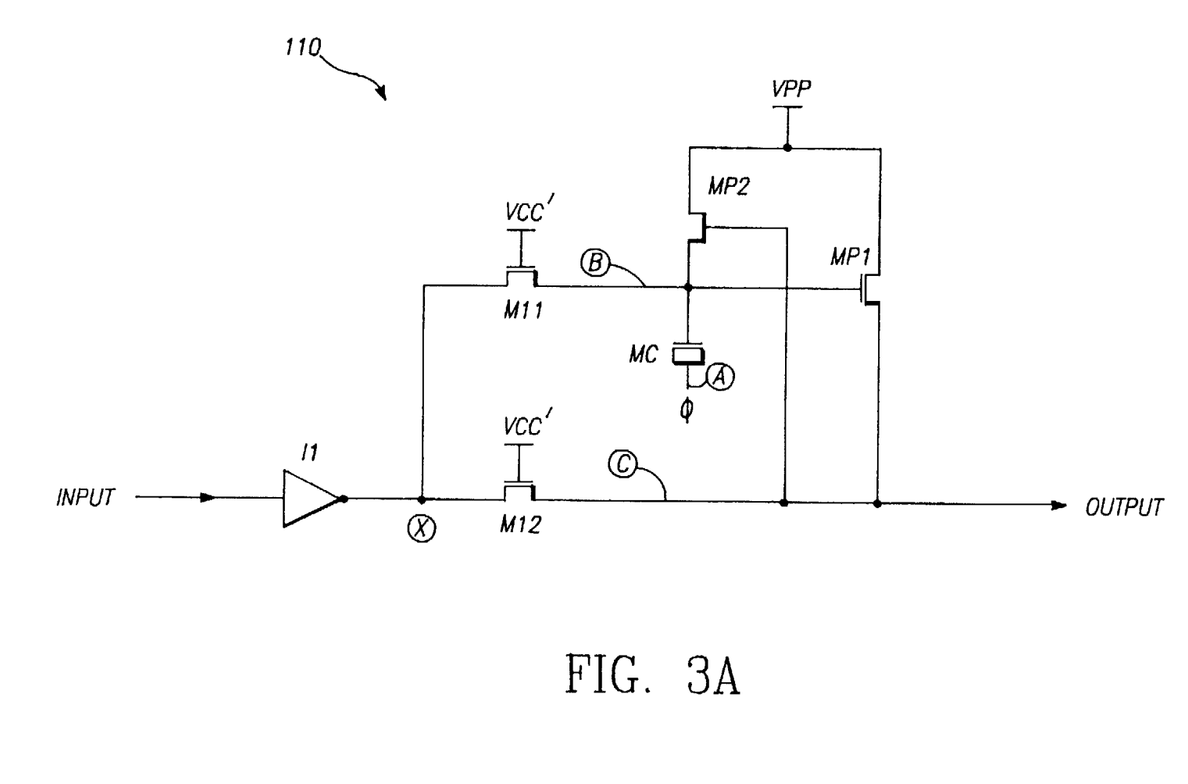
FIG. 3A is a block diagram of a preferred embodiment of the distribution charge pump of the present invention.

More specifically, referring to FIG. 3A, the present invention is a distribution charge pump for use in an EEPROM that includes a plurality of memory cells that can be programmed, erased and read by a host device. The distribution charge pump of the present invention includes an input buffer, four n-channel transistors and a capacitor. The input buffer provides at node X an input signal with an input signal range between 0 volts and VCC. A first, always-on, n-channel transistor MI2 has a drain, gate and source that are respectively coupled to the output of the input buffer (node X), a VCC' node and the output of the distribution charge pump (node C). When the input signal is at VCC, the output of the first transistor is at $VCC'-Vt_{MI2}$; otherwise, the output of the first transistor is at 0 volts. A second, always-on, n-channel transistor MI1 has a drain, gate and source that are respectively coupled to the output of the input buffer, VCC', and a first circuit node (node B).

Because the first transistor MI1 is always on, the output of the second transistor (node B) goes to $VCC'-Vt_{MI1}$ when the input signal (node X) goes to VCC.

The capacitor has one terminal coupled to the first node (B) and a second terminal coupled to a clock, the clock providing a clock signal to the capacitor, which stores provided at node B when the clock signal is high and discharges when the clock signal is low. A third n-channel transistor MP2 has a drain, gate and source that are respectively coupled to the VPP node, the distribution charge pump output (C) and the first node (B). This third transistor MP2 couples charge from VPP to the first node whenever the input signal (X) is high and the voltage difference between MP2's gate (node C) and source (node B) is greater than MP's threshold voltage. This can occur while the clock is high or low. A fourth n-channel transistor MP1 has a drain, gate and source that are respectively coupled to VPP, the first node (B) and the distribution charge pump output (C) so that the fourth transistor MP1 turns on more strongly for higher first node voltages, causing the distribution pump output to be pulled towards VPP, but never higher than VPP.

The capacitor and third and fourth transistors are configured so that, while the clock is high, the charge coupled by the third transistor MP2 to the first node (B) causes an increase in the voltage at the first node (B), which causes the fourth transistor MP1 to turn on and pull up the charge pump output (C). Those same elements are also configured so that, while the clock is low and the capacitor discharges, causing a lowering in the voltage at the first node (B), the third transistor MP2 turns on and couples some charge from the VPP node to the first node (B), thereby preventing the voltage at the first node (B) from dropping as much as it had previously increased while the clock was high. Due to this configuration, the output voltage (C) rises over subsequent clock cycles until it reaches, without exceeding, VPP. In another embodiment of the present invention, the distribution charge pump just described also includes a two input NAND gate with a first input coupled to the output of the input buffer, a second input coupled to a master clock node that supplies a master clock signal of the same period as the clock signal, and an output coupled to the clock node. This NAND gate supplies the clock signal to the capacitor only when the input signal is high so that leakage from the capacitor is eliminated when the input signal is low, reducing energy consumption by the charge pump when not enabled.

DESCRIPTION OF THE PREFERRED EMBODIMENT

Figure 1:
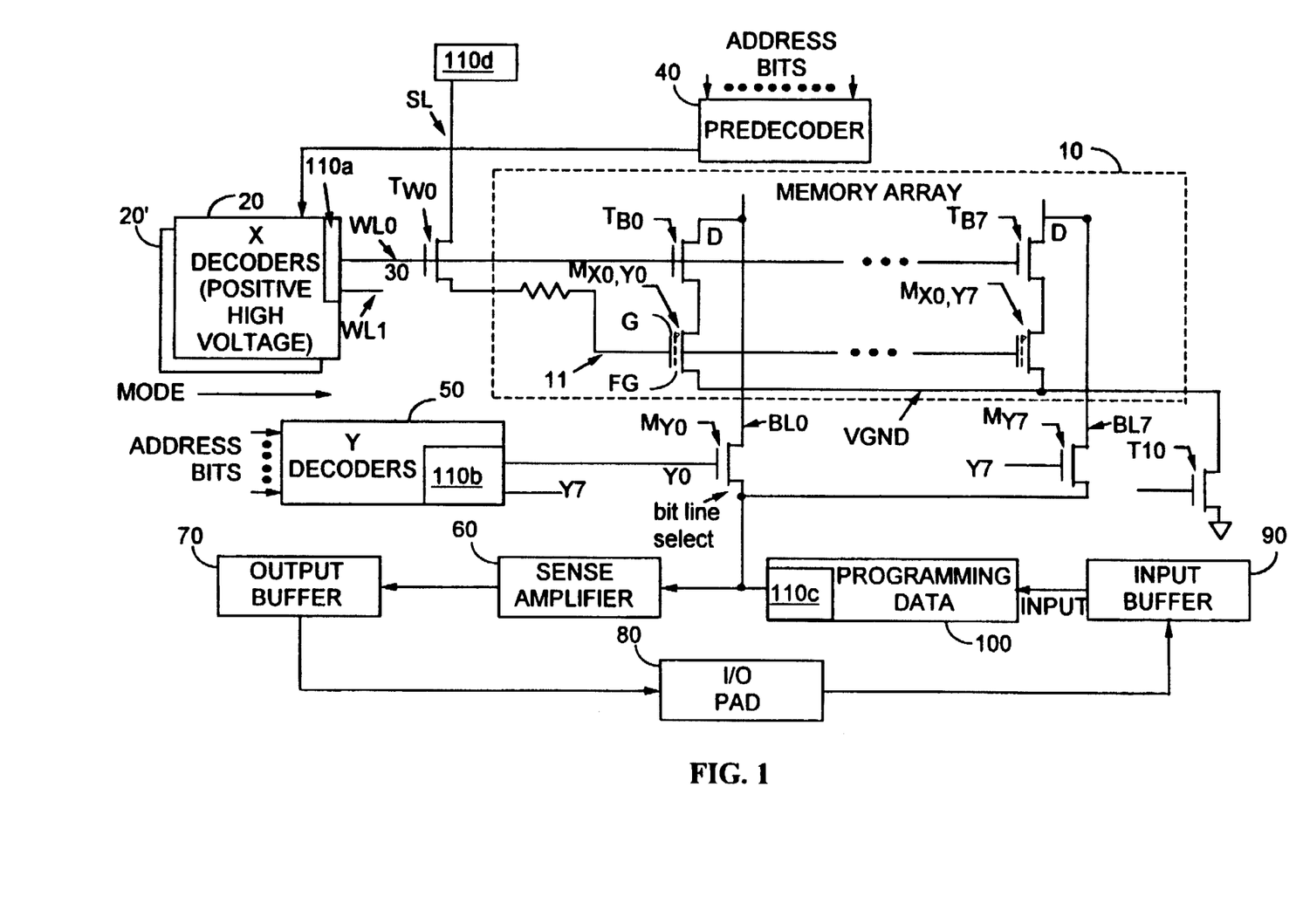
FIG. 1 is a block diagram of an EEPROM system with which the present invention may be practiced.

FIG. 1 is a block diagram of an EEPROM or flash memory cell architecture with which the present invention may be practiced. This architecture includes a memory array 10, and various components that interact with the memory array 10, including x-decoders 20, y-decoders 50, a predecoder 40, a sense amplifier 60, an output buffer 70, an I/O pad 80, an input buffer 90, a programming data interface 100 and sense lines SL. Each of the x-decoders 20, y-decoders 50, interface 100 and sense lines SL include a charge pump 110, which can be implemented in accordance with the present invention.

The memory array 10 includes a plurality of MOS memory cells $M_{x,y}$, such as cells $M_{x0,y0}$ and $M_{x0,y7}$, each cell having source and drain regions, a floating gate (denoted FG) and a control gate (denoted CG). A plurality of such cells in a given horizontal (or x-axis) row have their control gates coupled together by a conductor 11, one end of which is coupled to the source of a depletion-mode, enhancement-mode or native n-channel sense line selecting transistor, such as $T_{w0}$, which can have a threshold voltage between $-3$ and 0.9 volts. The drains of each of the cells is coupled to the source of a bit line switching transistor $T_{Bi}$ (where the subscript "Bi" denotes the bit index of the memory cell to which the bit line switching transistor $T_{Bi}$ is coupled) and the sources of each of the cells is connected to a virtual ground node (VGND), which can be set to various, mode-dependent voltage levels through the transistor T10, the drain of which is coupled to the VGND node. The word line switching transistor $T_{w0}$ has a gate coupled to a word line (e.g., WL0) that is controlled by an x-decoder 20 and a drain coupled to a sense line (SL) that is controlled by a sense line generator (not shown). The bit line switching transistor $T_{Bi}$ has a gate coupled to the same word line and a drain coupled to a corresponding bit line (BLi) output by a y-decoder 50. Whether a particular cell $M_{x,y}$ is programmed, erased or read depends on the voltage levels of the SL, WL, and $BL_i$ signals input to the bit line and word line switching transistors coupled that cell.

For example, in the memory architecture shown in FIG. 1, a memory cell $M_{x0,y0}$ is written by setting its associated word line and bit line selects to the positive high voltage level (15 VDC) while, simultaneously, the sense line is tied to 0 VDC, the VGND node is allowed to float and the programming data circuit 100 sends out a high potential (15 VDC). Under these conditions, the bit line switching transistor $T_{B0}$ turns on and sends 15V–Vt to the drain of its associated memory cell $M_{x0,y0}$. Simultaneously, the word line switching transistor $T_{w0}$ also turns on and sends the 0 VDC signal provided on the sense line to the control gate of the memory cell $M_{x0,y0}$. The resulting drain tunneling oxide region to control gate high positive potential (15V–Vt) attracts electrons out of the floating gate FG, leaving positive charge on the FG after the completion of the write. During this write process, no drain-source DC current flows in the cell because the VGND node is allowed to float.

Similarly, a cell $M_{x0,y0}$ is erased with data from the interface 100 by holding its associated word line at the positive high voltage level while the sense line and VGND are set at 0 VDC and 15 VDC, respectively, and the bit line BL0 is grounded to 0. This produces high control gate to drain tunneling oxide region potential and causes electrons to tunnel into the floating gate, leaving negative charge after the erase procedure is completed. Each word line is selectively pulled-up or pulled-down to a program, read or erase voltage level by an x-axis high voltage decoder. For example, in FIG. 1, the word lines WL0 and WL1 are controlled respectively by the decoders 20 and 20'. Each decoder 20 also includes a charge pump 110a, which, as described above, provides the positive high voltage signals needed to program and erase the EEPROM cells. The charge pump 110a of the preferred embodiment is described below in reference to FIGS. 3A–3D.

The memory of FIG. 1 also includes a predecoder 40, which receives input address information from a host device such as a microprocessor computing system (not shown) and outputs decoded signals to the x-decoders 20. In response, the appropriate x-decoders 20 will pull an associated word line up to a necessary voltage level as described above. More specifically, the positive high voltage x-decoder 20 pulls a selected word line WL in memory array 10 up to about +15 VDC (i.e., VPP) in program/write mode, and up to VCC (e.g., ≈+5 VDC) in read mode. If word line 30 is unselected, in program/write mode, decoder 20 pulls the word line down to 0 VDC.

A y-decoder 50 also receives address information from the host device. In conventional fashion, a plurality of cells in a column in the array have their source regions coupled together to form a bit line (BL). The output from the y-decoder 50 turns-on a y-axis select transistor, e.g., $M_{y0}$, which couples the bit line signal to the input of a sense amplifier 60 that reads the stored bit of information in the address-selected cell $M_{x0,y0}$. If, instead, cell $M_{x0,y7}$ is to be read, the y-decoder 50 will turn on the select transistor $M_{y7}$. For ease of illustration, only two bit lines, BL0 and BL7, are depicted in FIG. 1 although in practice array 10 will include a great many bit lines. As do the x-decoders, the each y-decoders also include a charge pump 110b, the preferred embodiment of which is described in reference to FIGS. 3A–3D.

In a read mode of operation, the sense amplifier output is coupled through an output buffer 70. The "0" or "1" signal stored in an addressed cell $M_{x,y}$ is then provided to an input/output pad 80, from where the information may be accessed by the host device.

Data to be stored within the array 10 is coupled to the input/output pad 80 by the host device, from where the data is coupled to an input buffer 90. The output of buffer 90 is provided to an interface 100 that provides suitable programming data for the array. Because writing a memory cell requires high voltage (e.g., 15V) to appear on the corresponding bit line, the interface 100 also includes a distribution charge pump 110c that pumps the 5 volt INPUT to the required level.

The system shown in FIG. 1 also receives from the host device MODE signals commanding either a program/write mode, erase mode, or a read mode.

Referring to FIG. 3A, there is shown a circuit diagram of the distribution charge pump 110 of the present invention, which can be incorporated in the memory described above, particularly in the x- and y- decoders 20, 50, the input buffer 100 and in the sense lines SL. The circuit 110 is enabled by a high-to-low transition of the input signal (INPUT) to generate an output signal (OUTPUT) that rises from 0 VDC to VPP. This is in contrast to the prior art charge pump, described in reference to FIG. 2A-2D, which provides an output signal that exceeds VPP. The resulting OUTPUT signal is coupled to an appropriate word line (WL) by the positive high voltage X decoders (FIG. 1) so that the appropriate cell can be programmed.

The charge pump of FIG. 3A includes an input buffer 11, NMOS enhancement-mode pass transistors Ml1 and Ml2, a MOS capacitor MC and two NMOS enhancement-mode pump transistors MP1 and MP2. In the preferred embodiment, these devices have threshold voltages that range between 0.2 and 0.8 VDC. The input buffer 11 is an inverting buffer that provides at node X an output that is coupled the drains, or inputs, of the transistors Ml1, Ml2. The source, or output, of the transistor Ml1 (node B) is in turn coupled to a gate of the MOS capacitor MC, the gate of the transistor MP1 and the source of the transistor MP2. The source, or output, of the transistor MP1 is tied to node C, which is also coupled to the output (OUTPUT) of the distribution charge pump and the gate of the transistor MP2. Other inputs to the charge pump include a clock signal $\phi$ (shown in FIG. 3B) that is coupled to the MOS capacitor's other terminal at node A, VCC', which is coupled to the gates of the transistors Ml2 and Ml2; and VPP, which is generated by the main charge pump (not shown). Note that VCC' can be held constant at VCC, or, as in the preferred embodiment, can be held at VCC in write and erase modes and at VCC+Vt in read mode so that full VCC signals appear on the OUTPUT node.

Figures 3B, 3C:
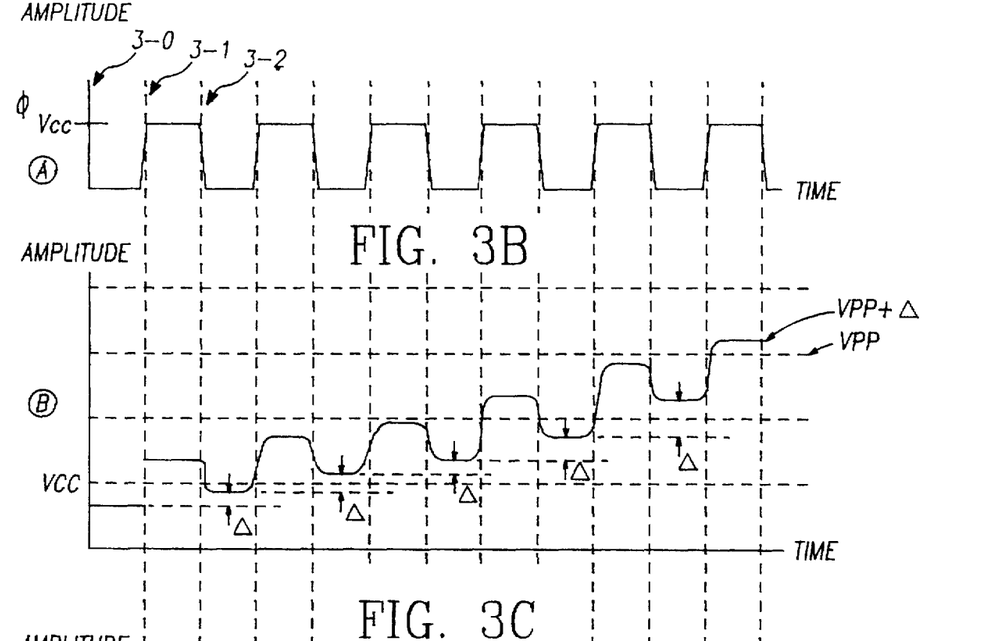
FIG. 3B is a voltage versus time plot of the clock signal provided at node A of FIG. 3A.
FIG. 3C is a plot of the voltage at node B of FIG. 3A while the charge pump is enabled.
Figure 3D:
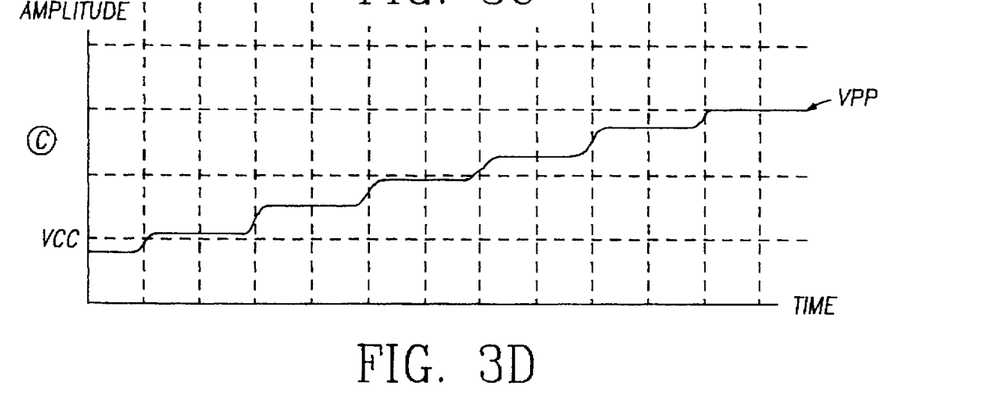
FIG. 3D is a plot of the output signal provided at node C by the charge pump of FIG. 3A.

FIGS. 3B, 3C and 3D respectively show voltage versus time plots of the clock signal $\phi$, the signal at node B and the OUTPUT signal at node C. The operation of the preferred embodiment of FIG. 3A is now described in reference to these figures. When the INPUT signal goes from high to low at time 3-0, the input buffer 11 generates a low to high signal at node X that is coupled to the transistors Ml2 and Ml1. Because the gate of the transistor Ml1 is always at VCC', the transistor Ml1 couples the voltage corresponding to input logic '1' from node X to node B and a gate of the capacitor MC. Of course, due to the capacitor MC at node B, the voltage at node B rises only gradually following the INPUT signal transition.

Because the drain of the transistor Ml2 is also tied to VCC', Ml2 couples the voltage corresponding to logic 1 from node X to node C. Because there is no capacitor coupled to node C, the voltage at node C rapidly rises to VCC'-Vt$_{Ml2}$ (where Vt$_{Ml2}$ is the threshold voltage of the pass transistor Ml2) following the INPUT signal transition. When node C is higher than node B by at least Vt, the transistor MP2 turns on and current flows from VPP to node B. This current flow allows charge storage on node B. As a result, the potential of node B is raised ever higher by the capacitor MC whenever the clock signal makes a transition from low to high. The transistor MP1 does not turn on until the voltage at node B exceeds the OUTPUT voltage by at least Vt$_{MP1}$ (the threshold of the transistor MP1). This cannot occur until sometime during the high clock phase of the first pumping cycle.

As shown in FIG. 3C, over subsequent cycles of the clock signal $\phi$ (FIG. 3B) the voltage at node B rises from approximately VCC to the positive high voltage level (VPP) through a series of positive and negative steps. For the output voltage at node C (which is shown in FIG. 3D) to maintain an increasing trend from 0 VDC to the pump voltage level VPP, the positive step size must be larger than the negative step size by a positive amount ($\Delta$). In the preferred embodiment, $\Delta$ is a function of the coupling ratio at node B ($\gamma$), which quantifies the relationship between charge stored by the capacitor MC and the voltage at node B (V$_B$); the amplitude of the clock signal (V$_\phi$) and the thresholds of the two transistors MP1 and MP2 (Vt$_{MP1}$ and Vt$_{MP2}$, respectively). This function is described by equation (1), below.

$$\Delta = \gamma \times V_\phi - Vt_{MP1} - Vt_{MP2} \quad (1)$$

Because $\Delta$ must be greater than or equal to zero for the upward trend to be maintained, equation (1) can be rewritten as shown in equation (2), below.

$$\gamma \times V_\phi \geq Vt_{MP1} + Vt_{MP2} \quad (2)$$

Thus, in the preferred embodiment, the transistors MP1 and MP2 and the capacitor MC are fabricated so that equation (2) always holds true. In other words, the increase in voltage on node B must be greater than the combined thresholds of MP1 and MP2 so that MP2 will turn on and leak charge into node B during the negative portion of the clock cycle.

For example, referring to FIG. 3C, at time 3-1, the clock signal $\phi$ rises to VCC, which has the effect of placing the capacitor MC in a charge storage mode. At the same time, the already-on transistor MP2 couples current and charge from the VPP node to node B, where the charge contributed by VPP is stored by the capacitor MC. This accumulated charge causes the voltage at node B (V$_B$) to rise, which eventually causes the transistor MP1 to turn on. Once turned on, the transistor MP1 pulls up the voltage of the OUTPUT signal (node C) until it rises to within a threshold drop (i.e., Vt$_{MP1}$) of V$_B$. In other words, the transistor MP1 enables the OUTPUT signal to track the increasing voltage at node B. As the result of node C being pulled up, MP2 turns on even more strongly, further increasing V$_B$, which in turn causes MP1 to turn on harder (i.e., the nodes B and C bootstrap each other). Based on the configuration of the circuit elements MC, MP1 and MP2, while the clock signal is high, V$_B$ and the OUTPUT signal stabilize (at higher than previous levels), with V$_B$ within Vt$_{MP2}$ of the OUTPUT voltage. The difference between V$_B$ levels for subsequent pumping cycles is denoted $\Delta$, as described above.

When the clock signal goes low (e.g., at time 3-2), node B begins to discharge through the capacitor MC, causing the voltage at node B (V$_B$) to drop. This discharge does not affect the OUTPUT signal (FIG. 3D), which is isolated from node B by the (now-off) transistor MP1. While the clock signal is low, V$_B$ falls more than Vt$_{MP2}$ below the OUTPUT voltage, which causes the transistor MP2 to strongly turn on. Once the transistor MP2 turns on, it supplies as much charge to node B from the VPP node as is discharged by the capacitor MC, which stabilizes V$_B$. The circuit elements of FIG. 3A are selected as described above so $\Delta$ is always positive. This means that, over subsequent pumping cycles, the OUTPUT of the charge pump is able to continue rising until it reaches VPP, but no higher, which is a key advantage over the prior art.

As the voltage at node B rises, the gate of the transistor MP1 is maintained at the same voltage as node B, which, like the prior art of FIG. 2A, can exceed VPP. However, because the drain of the transistor MP1 is coupled to VPP, no matter how large its gate voltage becomes, the source voltage of the transistor can never exceed VPP. Consequently, the OUTPUT is established at VPP by the distribution charge pump of the present invention and flash memory problems due to excessive word line pumping voltages are eliminated.

The preferred embodiment answers the need for a charge pump that provides a high voltage signal that does not exceed VPP. However, due to the very low thresholds of the transistor MP2 and the capacitor MC, even when the INPUT signal is low (i.e., when the pump is not enabled), a small amount of current is able to flow from the VPP node to the capacitor MC whenever the clock signal is low, resulting in unnecessary and undesirable power consumption by the charge pump. An alternative embodiment, shown in FIG. 4, prevents such unnecessary power consumption.

Figure 4:
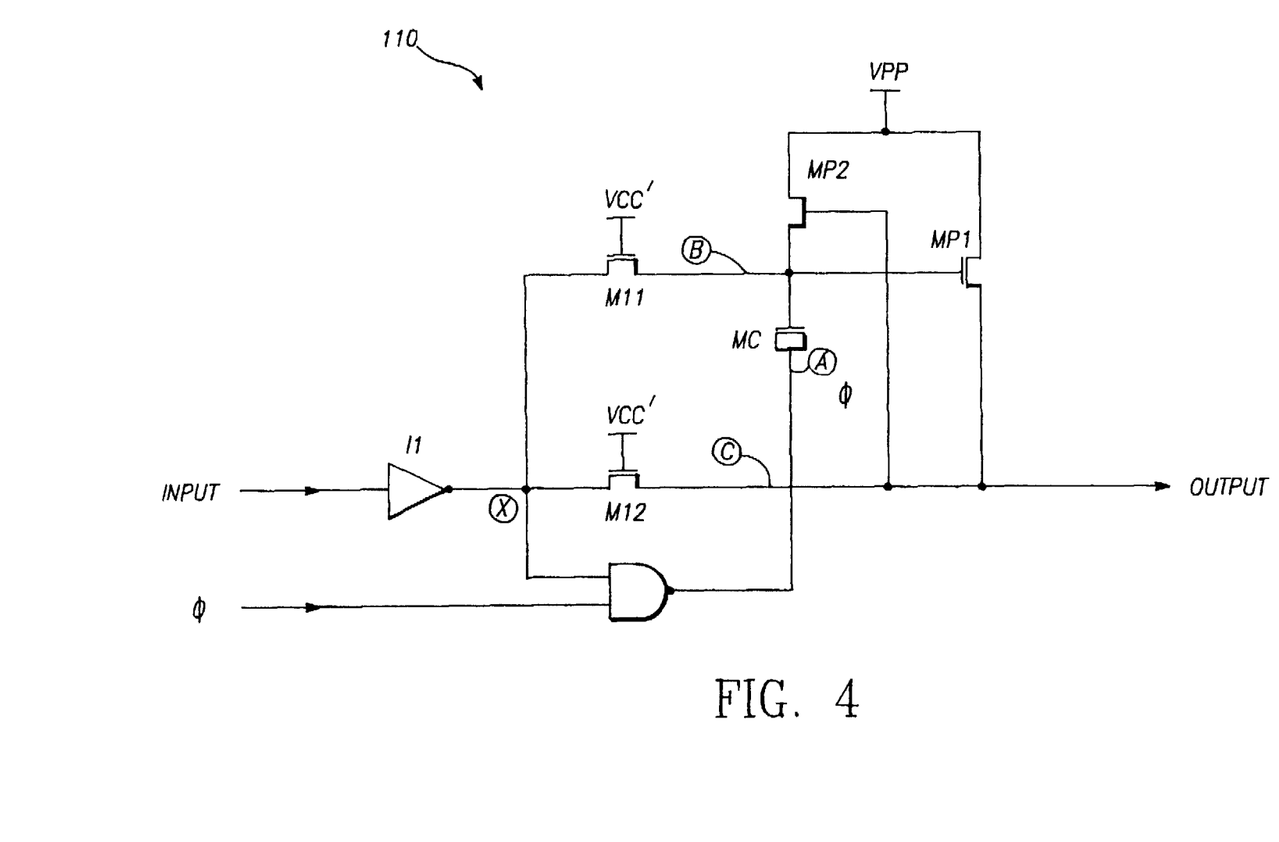
FIG. 4 is a block diagram of an alternative embodiment of the distribution charge pump of the present invention.

The alternative embodiment of FIG. 4 reduces power consumption by providing a NAND (NAND) gate that has one input coupled to the clock signal $\phi$ and the other input coupled to the output of the input buffer 11. The NAND gate's output $\phi'$ is coupled to one terminal of the capacitor MC at node A. Consequently the NAND gate blocks the clock signal $\phi$ by providing a high signal $\phi'$ as long as the charge pump is disabled (i.e., whenever the INPUT is high), which prevents leakage out of the capacitor MC. Whenever the charge pump is enabled (i.e., whenever the INPUT is low), the NAND gate provides a gated clock signal $\phi'$ that is the same as the input clock signal $\phi$, except that the clock signals $\phi'$ and $\phi$ are 180 degrees out of phase.

Modifications and variations may be made to the disclosed embodiments without departing from the subject and spirit of the invention as defined by the following claims.

What is claimed is:

1. A distribution charge pump for use in a non-volatile memory array that includes a plurality of memory cells that can be programmed, erased and read by a host device, said distribution charge pump comprising:

an input buffer providing an input signal with an input signal range between 0 VDC and VCC wherein said VDC is a DC voltage and VCC is a supply voltage;

a first n-channel transistor whose drain, gate and source are respectively coupled to the output of said input buffer, a VCC' node and the output of said distribution charge pump so that, when said input signal is at VCC, the source, or output, voltage of said first transistor goes to approximately VCC;

a second n-channel transistor whose drain, gate and source are respectively coupled to the output of said input buffer, said VCC' node, and a first circuit node so that, when said input signal is at VCC, the source, or output, voltage of said second transistor goes to approximately VCC;

a capacitor having one terminal coupled to said first node and a second terminal coupled to a clock, said clock providing a clock signal to said capacitor, said capacitor storing charge at said first node when said clock signal is high and discharging when said clock signal is low;

a third n-channel transistor whose drain, gate and source are respectively coupled to a VPP node, said distribution charge pump output and said first node, said third transistor coupling said first node to said VPP node when voltage difference between said first node and said charge pump output exceeds threshold of said third n-channel transistor, said coupling contributing charge to said first node that is stored by said capacitor when said clock signal goes from high to low, thereby increasing voltage at said first node and partially offsetting voltage loss at said first node caused by discharge of said capacitor when said clock signal goes from high to low; and a fourth n-channel transistor whose drain, gate and source are respectively coupled to said VPP node, said first node and said distribution charge pump output, said fourth transistor turning on more strongly for higher first node voltages, thereby pulling said distribution pump output towards a VPP level set at said VPP node, said fourth transistor, third transistor and capacitor being configured so that, due to charge supplied by said third transistor when said clock signal goes from high to low, said first node voltage rises higher than in the previous cycle when said clock signal goes from low to high, thereby allowing said output voltage to steadily rise to said VPP level and no further.

2. The distribution charge pump of claim 1, further comprising a two input NAND gate having a first input coupled to the output of said input buffer, a second input coupled to a master clock node that supplies a master clock signal of the same period as said clock signal, and an output coupled to said capacitor, said NAND output supplying said clock signal to said capacitor only when said input signal is high so that leakage from said capacitor is eliminated when said input signal is low.

3. The distribution charge pump of claim 1, wherein said transistors are N-channel enhancement devices with threshold voltages approximately between 0.2 VDC and 0.8 VDC.

4. The distribution charge pump of claim 3, wherein said capacitor is an N-channel enhancement device with a threshold voltage approximately between 0.2 VDC and 0.8 VDC.

5. The distribution charge pump of claim 1, wherein VCC is approximately between +2 VDC and +5 VDC and VPP is approximately between +11 VDC and +15 VDC.

6. The distribution charge pump of claim 1, wherein:

during program and erase operations performed on said memory cells said VCC' node is set to approximately VCC; and during read operations performed on said memory cells said VCC' node is set above VCC by approximately a threshold drop of said first and second transistors.

7. A distribution charge pump for use in a non-volatile memory array that includes a plurality of memory cells that can be programmed, erased and read by a host device, said distribution charge pump comprising:

an input buffer providing an input signal with an input signal range approximately between 0 VDC and VCC wherein said VDC is a DC voltage and VCC is a supply voltage;

a first n-channel transistor whose drain, gate and source are respectively coupled to the output of said input buffer, a VCC' node and the output of said distribution charge pump so that, when said input signal is at VCC, the source, or output, voltage of said first transistor goes to approximately VCC;

a second n-channel transistor whose drain, gate and source are respectively coupled to the output of said input buffer, said VCC' node, and a first circuit node so that, when said input signal is at VCC, the source, or output, voltage of said second transistor goes to approximately VCC;

a capacitor having one terminal coupled to said first node and a second terminal coupled to a clock, said clock providing a clock signal to said capacitor, said capacitor storing charge at said first node when said clock signal goes from low to high and discharging when said clock signal goes from high to low;

a two input NAND gate having a first input coupled to the output of said input buffer, a second input coupled to a master clock node that supplies a master clock signal of the same period as said clock signal, and an output coupled to said capacitor, said NAND output supplying said clock signal to said capacitor only when said input signal is high so that leakage from said capacitor is eliminated when said input signal is low;

a third n-channel transistor whose drain, gate and source are respectively coupled to a VPP node, said distribution charge pump output and said first node, said third transistor coupling said first node to said VPP node when voltage difference between said first node and said charge pump output exceeds threshold of said third n-channel transistor, said coupling contributing charge to said first node that is stored by said capacitor when said clock signal goes from high to low, thereby increasing voltage at said first node and partially offsetting voltage loss at said first node caused by discharge of said capacitor when said clock signal goes from high to low; and a fourth n-channel transistor whose drain, gate and source are respectively coupled to said VPP node, said first node and said distribution charge pump output, said fourth transistor turning on more strongly for higher first node voltages, thereby pulling said distribution pump output towards a VPP level set at said VPP node, said fourth transistor, third transistor and capacitor being configured so that, due to charge supplied by said third transistor when said clock signal goes from high to low, said first node voltage rises higher than in the previous cycle when said clock signal goes from low to high, thereby allowing said output voltage to steadily rise to said VPP level and no further;

said transistors being n-channel enhancement devices with threshold voltages approximately between 0.2 VDC and 0.8 VDC.

8. The distribution charge pump of claim 7, wherein said capacitor is an N-channel enhancement device with a threshold voltage approximately between 0.2 VDC and 0.8 VDC.

9. The distribution charge pump of claim 7, wherein VCC is approximately between +2 VDC and +5 VDC and VPP is approximately between +11 VDC and +15 VDC.

10. The distribution charge pump of claim 7, wherein:

during program and erase operations performed on said memory cells said VCC' node is set to approximately VCC; and during read operations performed on said memory cells said VCC' node is set above VCC by approximately a threshold drop of said first and second transistors.

11. A distribution charge pump for use in a non-volatile memory array that includes a plurality of memory cells that can be programmed, erased and read by a host device, wherein said distribution charge pump pumps a VCC level input signal to a high voltage output signal suitable for distribution throughout said memory array, said distribution charge pump comprising:

a capacitor having one terminal coupled to a first node and a second terminal coupled to a clock, said clock providing a clock signal to said capacitor, said capacitor storing charge at said first node when said clock signal is high and discharging when said clock signal is low;

a circuit having an input driven by said input signal and two outputs respectively coupled to said first node and the distribution charge pump output, said circuit being configured to output respective first and second high signals at said outputs in response to an input signal transition, said capacitor ensuring that said first high signal output to said first node rises more slowly than said second high signal output to said distribution charge pump output;

a third n-channel transistor whose drain, gate and source are respectively coupled to a VPP node, said distribution charge pump output and said first node, said third transistor coupling said first node to said VPP node when voltage difference between said first node and said charge pump output exceeds threshold of said third n-channel transistor, said coupling contributing charge to said first node that is stored by said capacitor when said clock signal is low, thereby increasing voltage at said first node and reducing voltage loss at said first node caused by discharge of said capacitor when said clock signal is low; and a fourth n-channel transistor whose drain, gate and source are respectively coupled to said VPP node, said first node and said distribution charge pump output, said fourth transistor turning on more strongly for higher first node voltages, thereby pulling said distribution pump output towards a VPP level set at said VPP node, said fourth transistor, third transistor and capacitor being configured so that, due to charge supplied by said third transistor when said clock signal is low, said first node voltage rises further when said clock signal is high than said first node voltage falls when said clock signal is low, thereby allowing said output voltage to steadily rise to said VPP level and no further.

12. The distribution charge pump of claim 11, further comprising a two input NAND gate having a first input coupled to the output of said input buffer, a second input coupled to a master clock node that supplies a master clock signal of the same period as said clock signal, and an output coupled to said clock node, said NAND output supplying said clock signal to said capacitor only when said input signal is high so that leakage from said capacitor is eliminated when said input signal is low.

13. The distribution charge pump of claim 12, wherein said transistors are N-channel enhancement devices with threshold voltages approximately between 0.2 VDC and 0.8 VDC wherein said VDC is a DC voltage.

14. The distribution charge pump of claim 13, wherein said capacitor is an N-channel enhancement device with a threshold voltage approximately between 0.2 VDC and 0.8 VDC.

15. The distribution charge pump of claim 12, wherein the VCC level is approximately between +2 VDC and +5 VDC and VPP is approximately between +11 VDC and +15 VDC.

16. The distribution charge pump of claim 12, wherein:

during program and erase operations performed on said memory cells said VCC' node is set to approximately VCC; and during read operations performed on said memory cells said VCC' node is set above VCC by approximately a threshold drop of said first and second transistors.

* * * * *